(12) United States Patent
Waldrop et al.

(10) Patent No.: US 7,691,280 B2
(45) Date of Patent: Apr. 6, 2010

(54) INK JET PRINTING OF ETCHANTS AND MODIFIERS

(75) Inventors: Robert Paul Waldrop, Chapel Hill, NC (US); Steven Dale Ittel, Wilmington, DE (US); Howard E. Simmons, III, Wilmington, DE (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 12 days.

(21) Appl. No.: 11/387,460

(22) Filed: Mar. 23, 2006

(65) Prior Publication Data

US 2006/0213870 A1 Sep. 28, 2006

Related U.S. Application Data

(60) Provisional application No. 60/665,098, filed on Mar. 25, 2005.

(51) Int. Cl.
*B44C 1/22* (2006.01)

(52) U.S. Cl. .............................. 216/87; 216/91; 216/92; 216/96; 216/103

(58) Field of Classification Search .................. 216/87, 216/91, 92, 96, 103
See application file for complete search history.

(56) References Cited

U.S. PATENT DOCUMENTS

| | | | |
|---|---|---|---|
| 4,755,587 A | | 7/1988 | Rinehart |
| 4,792,573 A | | 12/1988 | Cohn |
| 5,049,480 A | | 9/1991 | Nebe et al. |
| 5,411,583 A | | 5/1995 | Bennison et al. |
| 6,599,582 B2 * | | 7/2003 | Kiguchi et al. .............. 427/466 |
| 6,973,710 B2 * | | 12/2005 | Kiguchi et al. ................ 29/601 |
| 2003/0029831 A1 * | | 2/2003 | Kawase ........................ 216/27 |
| 2003/0181042 A1 * | | 9/2003 | Chen et al. .................. 438/689 |
| 2004/0160466 A1 * | | 8/2004 | Annacone ........................ 347/2 |
| 2004/0188531 A1 | | 9/2004 | Gengel et al. |
| 2005/0089679 A1 | | 4/2005 | Ittel et al. |
| 2005/0118813 A1 * | | 6/2005 | Korzenski et al. ........... 438/689 |
| 2006/0292821 A1 * | | 12/2006 | Young ........................ 438/427 |

* cited by examiner

Primary Examiner—Binh X Tran

(57) ABSTRACT

The present invention is directed to processes for ink jet printing of etchant or modifier materials for creating patterns, particularly for electronics and display applications. The present invention also relates to devices made using the processes.

17 Claims, No Drawings

INK JET PRINTING OF ETCHANTS AND MODIFIERS

This application claims the benefit of U.S. Provisional Application No. 60/665,098, filed on Mar. 25, 2005.

FIELD OF THE INVENTION

The present invention is directed to processes for ink jet printing of etchant or modifier materials for creating patterns, particularly for electronics and display applications. The present invention also relates to devices made using the processes.

TECHNICAL BACKGROUND

The electronics, display and energy industries rely on the formation of coatings and patterns of conductive and other electronically active materials to form circuits on organic and inorganic substrates. The primary methods for generating these patterns are screen printing for features larger than about 100 µm and thin film and etching methods for features smaller than about 100 µm. Other subtractive methods to attain fine feature sizes include the use of photo-patternable pastes and laser trimming.

It is the trend in the electronics industry to make smaller and less expensive electronic devices that provide higher resolution and enhanced display performance. As a result, it has become necessary to develop new materials and new approaches to manufacture such devices.

The ink jet printing system is a high resolution, additive printing system having the ability to print complex patterns through digital instructions. This ink jet printing system is a recording system, which prints by discharging ink drops through a discharge orifice such as a nozzle or a slit to thus make the ink drops directly adhere to a printing substrate. Ink jet techniques usually fall into two broad categories: continuous injection systems and on-demand systems. In continuous injection systems, the ink jet is firing a continuous stream of microdrops and the pattern is established by selectively diverting, or not diverting, the microdrops to a waste reservoir. This system cannot be viewed as fully additive in that the portion of material diverted to the reservoir is lost, making the process less than 100% additive. In the on-demand system, drops are fired only when required. These systems are more prone to clogging when employing inks with high solids content, and it is a common feature that the first several drops on demand may not be ejected as expected.

Ink jet printing is at its optimal utility when small complex patterns are required. By its nature, using picoliter drops at a time, the process is slow for patterns where large features requiring large quantities of ink are desired.

At times it will be preferable to coat an entire substrate with a surface layer and then in a subtractive process, etch away the undesired portion of the image. On the nano-scale, this is one of the fundamental underlying processes of the semiconductor industry. Their technology is aggressive and well suited to small devices but there are many instances where the resolution of the semiconductor industry is not required. The selective removal of material in a digitally-controlled pattern is desired. This is often done by laser ablation, but the technique is difficult when the underlying material is thermally sensitive and particularly difficult when the layer to be removed is transparent and the layer below it to be left is opaque.

A technique to selectively etch portions of one layer while not damaging the subsequent underlayer will find utility in a wide variety of applications. Ink jet printing of etchants that will selectively remove or ink jet printing of modifiers that will selectively transform a layer of material without damaging the underlying layer provides a highly useful method for the design of electronic or photonic circuits, ornamental patterns, photovoltaic devices and a variety of other useful systems.

Despite the advances in such systems, the multiple, time-intensive steps required for current etching techniques employing resists are a limitation to manufacturing. Manufacturers are continuously seeking improved techniques and compositions that can fulfill their needs for selective materials removal. The techniques may be used in very specific applications if they provide greater speed and more specific materials removal. Such materials can increase the speed of the manufacturing processes without compromising high resolutions in the lines and spaces of the circuit or display patterns. The present invention is directed to such processes, materials and compositions suitable for implementation of the processes, and methods for production of the materials.

SUMMARY OF THE INVENTION

The present invention relates to a process comprising the steps of: providing a substrate having a surface layer thereon wherein said surface layer comprises a substrate-side and a surface-side; providing a deposit composition comprising from 1 to 50 percent by weight of an etchant or modifier in a dispersing vehicle; jetting droplets of said deposit composition onto the surface-side of said surface layer in an image-wise manner; allowing the etchant or modifier in the composition to react with the surface layer on said substrate thus forming products of the etching reaction and thereby removing or otherwise modifying the physical properties of the surface layer in the desired image.

The present invention further relates to a method of forming an RFID device comprising the steps of: providing a substrate having a surface layer thereon wherein said surface layer comprises a substrate-side and a surface-side; providing a deposit composition comprising from 1 to 50 percent by weight of an etchant or modifier in a dispersing vehicle; jetting droplets of said deposit composition onto the surface-side of said surface layer in an image-wise manner; allowing the etchant or modifier in the composition to react with the surface layer on said substrate thus forming products of the etching reaction and thereby removing or otherwise modifying the physical properties of the surface layer in the desired image. In one embodiment of the present invention, the method(s)/process(es) above further comprise depositing an encapsulant composition onto said surface layer and substrate, wherein said encapsulation composition either partially or entirely covers said surface layer and substrate. Optionally, the substrate may be washed to remove excess deposit composition and reaction products of the etching or modification.

Also provided are articles made using the processes disclosed herein.

These and other aspects of the invention will be apparent to one skilled in the art in view of the following detailed description and the appended claims.

DETAILED DESCRIPTION

The method described herein comprises the inkjet printing of a solution (deposit composition) of an etchant or modifier in a solvent onto a thin surface layer of material which has been coated onto a substrate for the purpose of producing a useful pattern on said substrate by the selective removal or modification of the thin layer material. The removal may be accomplished by the chemical reaction of the etchant with the surface layer to convert it to a soluble form that may be washed from the surface. The modification of the surface layer is accomplished by the chemical reaction of the surface layer with the modifier to convert it to a form in which some important physical property has been changed in a detectable and useful manner.

The etching or modifying composition may contain a variety of other materials that aid in the formulation of the composition, the printing of the composition, or the performance of the composition in end use applications. Patterns of the composition are printed onto a substrate by an inkjet printing process. The patterns are formed by ink jetting the deposit composition in a "image-wise" manner. The term "image-wise," (also "pattern-wise") as used herein means that the deposit composition is deposited on the surface layer of the substrate in such a way as to form an image on the surface. The desired pattern is generally designed to create a working electronic circuit, however, it is noted that the desired pattern may also be used to create a particular identifying design. For example, a company name or trademark may be patterned onto the surface layer for the pure purpose of providing an identifying feature on the substrate.

In general, the surface layers on substrates being etched or modified will be thin layers of one material coated on another—for instance a one micron layer of aluminum on a glass surface. The etchant formulations are allowed to react with the surface to remove the thin layer of material from that surface and the surface of the substrate may then optionally be washed to remove the etchant and its reaction products. The modifier formulations are allowed to react with the thin layer of material on the surface of the substrate to modify some specific physical property of the surface layer while leaving it largely intact and then the surface of the substrate may then optionally be washed to remove the modifier and its reaction products.

Inkjet printing is accomplished with a digitally-controlled ink jet printer. An inkjet printer is a device for directional and positional deposition of droplets of ink or other materials in a pattern-wise manner and such devices are well known to those skilled in the field as well as by the general public. The portion of the printer actually ejecting the droplets is referred to as an inkjet printer head and the orifice from which the ink is ejected is referred to as the printhead nozzle or simply nozzle. Inkjet printheads can be either a thermal inkjet device or a piezoelectric inkjet device depending upon the mechanism for the ejection process. Again, this differentiation and the availability of other printing methods are well known to those skilled in the art.

The present invention is applicable to printing systems that make use of various types of print cartridges such as those which include a printhead portion and a separate ink container portion, spaced from the printhead, that is used to either continuously or intermittently replenish the printhead portion with ink. The ink in the system is highly loaded with the active phase material plus other ink components.

The ink cartridge includes a printhead portion that is responsive to activation signals from the printing system for selectively depositing ink on the substrate. In the exemplary embodiment, the print cartridge includes a plurality of electrical contacts that are disposed and arranged on the print cartridge so that when properly inserted into the scanning carriage, electrical contact is established between corresponding electrical contacts associated with the printer portion. In this manner, activation signals from the printer portion are provided to the inkjet printhead for ejecting ink. The inkjet printhead can be either a thermal inkjet device or a piezoelectric inkjet device.

The information source is a host device and digitally stores and processes the image to be printed. The host is a computer, processor or any other device that provides an image to be printed to the printing system. The image provided by the host is in one of a number of types, such as, an image description using an image description language or a bit map image. Some examples of the host are a personal computer (PC) or an internet link for directly receiving image information from an internet source.

The printer portion of the device includes an input device for receiving information from the host and a storage device for storing image information. The printing device further includes a printer controller capable of selectively receiving image information from each of the input device and the storage device. The printer controller provides image information to the print mechanism. The print mechanism provides control signals to a substrate transport device for transporting the substrate through the print zone. In addition, the print mechanism includes a carriage transport device for controlling movement of the carriage through the print zone as the printer controller selectively activates the inkjet printhead on the cartridges to selectively form images on the print substrate.

Although, the printing system is described herein as having a printhead that is disposed in a scanning carriage, there are other arrangements of achieving relative movement between the printhead and substrate. For example, the printing system can also be configured to have a fixed printhead portion and wherein the substrate is moved past the fixed printhead. Another example is where the substrate is fixed and the printhead is moved past the fixed substrate.

The input device receives the image information from the host and converts this image information into a format suitable for the printer controller. The input device typically performs various process functions as well as buffering functions on image information prior to providing this information to the printer controller.

The process of jetting an individual droplet from a piezoelectric inkjet head is controlled by a waveform programmed into the controlling computer. This waveform, dependent upon the nature of the inkjet head and the ink, consists of multiple components. With the voltage set at some initial voltage, those components include a trapezoidal rise to a dwell voltage. The dwell voltage is held as the cavity resonates and fluid is withdrawn into the inkjet head. The fall takes the voltage to a value lower than the initial voltage where the echo holds to eject the droplet. There is then a final rise back to the initial voltage so the remaining fluid is withdrawn back into the head, thereby detaching the droplet tail from the inkjet head. The timing of the three voltage levels and the two ascents and intervening descent are related through the pulse rate and the resonance properties of the inkjet head and the fluid dynamics. For any given ink, it is usually possible to find some wave forms that will give droplets of varying sizes in a reliable manner. As atmospheric or other operational conditions change, it is possible that the window of operability will move beyond the chosen waveform and satellites will appear under identical operating conditions. It is preferable to have an ink system that by its nature has a wide operational window so that as printing conditions drift, operability is maintained. In addition to modifications of the wave forms driving printheads, it is also possible to vary the size of a nozzle on a printhead and thereby vary the quantity of ink that will be ejected.

The etching composition utilized herein comprises a solvent containing an etchant that can remove material from a surface on which the composition is deposited. Alternatively, the composition contains a modifier that can transform the physical properties of a substrate surface on which the composition is deposited. Finally, the composition can contain a variety of other materials that aid in the formulation of the composition, the printing of the composition, or the performance of the composition in end use applications.

The terms "substrate" refers to the material underlying the "surface layer" to which the etchant or modifier is applied to form an image. The substrate does not react with the etchants or modifiers described herein, but rather, provides a physical support for the thin surface layer. Substrates include glass, ceramics, metals; and plastics that can range from flexible to inflexible. This paragraph is not meant to be at all inclusive, but rather is illustrative of the wide variety of materials for which the processes disclosed herein are applicable. The substrate may also be metal providing that the metal is inert to the etchants or modifiers. By their nature, the surface layers and the substrate will generally be "non-absorbent" meaning that there is little to no penetration of the fluid portion of the etchant into the surface layer or substrate before the solvent vehicle evaporates.

A "surface layer" is a layer of material coating the surface of a substrate that is subject to the action of the etchant or modifiers described herein. The surface layer may be deposited on the surface of the substrate by vapor deposition, sputtering, ink-jet printing or other printing techniques, electroplating or electroless plating, painting or a variety of other techniques. The surface layer may also be formed by chemical reaction of the substrate. For instance, there may be a surface layer of alumina on an aluminum surface due to oxidation, or the surface of aluminum may be anodized. In general the surface layer will be between 0.01 and 10 µm in thickness with 0.1 to 2 µm being more typical.

Typical combinations of surface coatings (surface layers) and substrates would include the following: indium tin oxide (ITO) on polyester plastic, aluminum on glass, silver on ceramic, copper on ceramic, nickel on glass, or ITO on silicon. Of course, other conductive surface layers may be useful, including but not limited to thick film paste and tape compositions comprising Ag, Au, Pd, Pt, Al, Cu, Ni, etc. Less obvious but equally valid examples of surface layer/substrate combinations might include Kapton® polyimide on copper, polyester on copper, or polythiophene on Kapton® polyimide. In these latter examples, the etchant would be removing a polymeric layer that had been coated onto a substrate. In a more specific example, a complex copper pattern on a substrate may be coated with a layer of insulating Kapton® polyimide. The Kapton® polyimide insulator may then be removed in selective locations to provide vias for electrical contact from the top to the bottom of the Kapton® polyimide layer.

An "etchant" is a solution for chemical reaction that can be used to remove a thin layer of material from a substrate surface in a pattern-wise manner to reveal macro- or microstructures. A selective etchant reacts with the surface layer of material to remove it substantially completely while leaving subsequent layers untouched. Most commonly, a thin layer of metal coated onto a surface by evaporation sputtering or chemical vapor deposition is masked to protect those portions not to be removed and then the etchant can be applied to the entire surface to remove only the exposed portions.

In contrast to normal etching procedures where a pattern is masked and the etchant is applied to the entire surface, the processes disclosed herein does not require masking and the etchant is applied only to those portions of the pattern where removal is desired. Nonetheless, for some particularly complex patterns, it may be desirable to mask some portions of the substrate yet still take advantage of the desirable attributes of the inkjet printing process.

Etchants are well known in the industry. A listing of etchant systems for metals on glass, ceramic or polymeric surfaces listed by metal to be etched includes:

Aluminum
1. "metal etch" (3:3:1:1 $H_3PO_4$:$HNO_3$:$CH_3COOH$:$H_2O$)
2. "Al fine line etch 1" (4:1:4:1 $H_3PO_4$:$HNO_3$:$CH_3COOH$:$H_2O$)
3. "Al fine line etch 2" (1:2 HCl:$H_2O$)
4. "Al fast etch" (17:1:3 $H_3PO_4$:$HNO_3$:$CH_3COOH$:$H_2O$)
5. Copper based (5:20:75 CuCl:$NH_4Cl$:$H_2O$)
6. Oxalic acid (8:92 $H_2C_2O_4$:$H_2O$)

Antimony
1. "metal etch" (3:3:1:1 $H_3PO_4$:$HNO_3$:$CH_3COOH$:$H_2O$)

Chromium
1. "Cr acid etch" (1:1 HCl:glycerine)
2. "Cr base etch" (1:3 [50 g NaOH+100 ml $H_2O$]:[30 g $K_3Fe(CN)_6$+100 ml $H_2O$])

Gold
1. "Aqua Regia" (3:1 HCl:$HNO_3$)
2. "Au mask etch" (4:1:40 KI:$I_2$:$H_2O$)

Copper
1. "Persulfate" 15:100 Sodium persulfate:$H_2O$~20 s/micron @ 45 C When free of Fe, this solution is selective for Cu against Ni (added iron salts will cause Ni corrosion)

Nickel
1. "metal etch" (3:3:1:1 $H_3PO_4$:$HNO_3$:$CH_3COOH$:$H_2O$)

Silver
1. "dilute metal etch" (3:3:23:1 $H_3PO_4$:$HNO_3$:$CH_3COOH$:$H_2O$)
2. "silver base etch" (1:1:4 $NH_4OH$:$H_2O_2$:$CH_3OH$) 0.36 micron/min
3. Copper based (5:20:75 CuCl:$NH_4Cl$:$H_2O$)
4. KI etch 4:1:40 KI:$I_2$:$H_2O$
5. Basic peroxide 10:10:40 $NH_4OH$:$H_2O_2$:MeOH
6. Ferric etch (2:8 $Fe(NO_3)_3$:$H_2O$, heated to about 40° C.
7. Sulfamic acid (1:9 $H_2NHSO_3$:$H_2O$ Titanium
1. Titanium etch 2 (1:9 HF:$H_2O$)
2. Saturated oxalic acid in water In the above listing most of the etchants are strong acid systems. Those that are not include those that are basic (Cr2, Ag2,5) and those that rely upon redox or chelation chemistry to accomplish the etching process (Al5,6, Au2, Cu1, Ag3,4,6,7, Ti2). In addition to these materials, it may be desirable to etch other materials. Aqueous HCl will etch indium tin oxide. Aqueous HF will etch silica, titanium and other early transition metals. Both are strong acids. Strong base will etch glass, aluminum, or other metal oxides. Appropriate etchants for various materials can be selected by one skilled in the art.

In addition to these materials, it may be desirable to etch other materials. Aqueous HCl will etch indium tin oxide. Strong base will etch glass or other metal oxides. Aqueous HF will etch silica, titanium and other early transition metals.

Complete etching of the thin layer metal layer on the surface of the substrate will eliminate the metallic conductivity of the surface. If that is all that is required, any resulting residue may be left in place. For most applications, however, the residue is removed by washing. The above examples of etchant compositions can be modified for ink jet printing by the addition of water soluble, polymeric materials to the water-based compositions. This must be done with some caution because, for instance in the relatively concentrated nitric acid compositions, the nitric acid may react violently with the organic polymers. Inkjet printheads are not necessarily designed for use with these aggressive materials so that issue will also have to be considered. An all-ceramic spinneret will resist most acid compositions, but may not be resistant to the basic compositions.

As an alternative to etching, a "modifier" can be used. A modifier is a chemical that can transform the physical properties of a thin layer on a substrate layer from one form to another. These can include the modification of color or lack thereof, electrical or thermal conductivity, dielectric constant, emissivity, fluorescence, phosphorescence, etc. For example, a portion of a conductive metal layer can be transformed to a metal oxide or sulfide layer, which will render that portion of the layer non-conductive. Thin layers of indium tin oxide (ITO) are utilized as transparent conductors in electronics applications, but by changing the doping of an ITO layer, the conductivity or optical transparency of that layer can be modified. A transparent layer can be transformed into a colored or even black layer to prevent the transmission of light. Laser trimming of the impedance of capacitor dielectric layers can be modified by chemically modifying the dielectric constant of the active layer. Luminescent or phosphorescent layers can be quenched with optical quenchers. For purposes of classification, a major difference between an etchant and a modifier is that modifiers are typically left in place and etchants are generally removed from the surface of the substrate. For instance, base treatment of an aluminum surface will result in the transformation of the aluminum to alumina. If the alumina is left in place on the substrate, then this might be considered to be a modifier, but if the surface is then washed to remove the alumina, then the transformation might more properly be described as etching. Classification of a material as a modifier or etchant is not critical, and the two types of materials can be used interchangeably in the compositions and processes disclosed herein.

When an amount, concentration, or other value or parameter is recited herein as either a range, preferred range or a list of upper preferable values and lower preferable values, the recited amount, concentration, or other value or parameter is intended to include all ranges formed from any pair of any upper range limit or preferred value and any lower range limit or preferred value, regardless of whether such ranges are separately disclosed. Where a range of numerical values is recited herein, unless otherwise stated, the range is intended to include the endpoints thereof, and all integers and fractions within the range. It is not intended that the scope of the processes and compositions disclosed herein be limited to the specific values recited when defining a range.

The etching solution may contain "enhancing polymers" and "additives." An "enhancing polymer" is an added oligomer or polymer that can be included to improve any aspect of the printing or etching process. For example, the enhancing polymer can increase the viscosity of the etching solution so that it does not spread out on the surface of the substrate. The enhancing polymer may also be added to modify the viscosity of the solution to aid the printing process. An "additive" is a non-polymeric material that is added to the etching solution for a variety of purposes. Useful additives include sequestering agents, biocides, surface-active ingredients, dyes and pigments, and preservatives. These additives are included to improve the shelf life of the etchant, to modify the surface tension of the ink for printing and spreading on the substrate surface, to allow the visualization of the process while it is in progress, to modify the activity of the etchant, and for many other purposes. Additional components known to those skilled in the art can be present in the composition, including dispersants, stabilizers, release, agents, dispersing agents, stripping agents, and antifoaming agents. Examples of suitable additional components are those disclosed in U.S. Pat. No. 5,049,480. Finally, the enhancing polymer may be a sequestering agent designed to solubilize the metal ions produced during the etching process.

A "sequestering agent" is a material added to promote etching by removal of the byproducts of the etching process. Sequestering agents are particularly helpful when the solvent chosen is not a good solvent for the resulting products of the etching process. Sequestering agents include zeolites and related species if they are solids, and complex multidentate ligands if allowed to remain in solution. For example, the family of compounds known as siderophores can be used as sequestering agents, due to their relatively high affinity for iron.

It is highly desirable that any inkjet head and other associated hardware or dispensing device used in the processes be resistant to the etchant. Ceramics are particularly good for acid-based etchants, but are sometimes attacked by base. Metals are resistant to base but may be attacked by acids.

The term "solvent", as used herein, refers to fluids that are solvents or mixtures of solvents compatible with the etchants or modifiers. Mixed solvents can be used. For example, it may be useful to combine water with an alcohol or glycol to modify the rate of evaporation of the overall solvent mixture. Similarly, butyl acetate solvent can be used in conjunction with 2,2,4-trimethyl-1,3-pentanediol monoisobutyrate to modify the rate of evaporation. Solvent(s) for use in the processes disclosed herein desirably have sufficiently high volatility to enable the solvent to be evaporated from the dispersion by the application of relatively low levels of heat at atmospheric pressure, thereby concentrating the etchant or modifier material in the surface. However, it is preferred that the solvent not be so volatile that the ink rapidly dries at normal room temperatures, during the inkjetting process. Preferred solvents for use in the compositions have boiling points at atmospheric pressure of less than 300° C. and preferably less than 250° C. For more polar polymer systems, such solvents include water, aliphatic alcohols, esters of such alcohols, for example, acetates and propionates; terpenes such as pine oil and alpha- or beta-terpineol, and mixtures thereof; ethylene glycol and esters thereof, such as ethylene glycol monobutyl ether and butyl cellosolve acetate; carbitol esters, such as butyl carbitol, butyl carbitol acetate and carbitol acetate and other appropriate solvents such as TEXANOLB (2,2,4-trimethyl-,3-pentanediol monoisobutyrate). When using these organic solvents, the chemical reactivity of the etchants must be borne in mind. Strong oxidants and acids may react violently with some of these organic materials so working combinations much be prepared with due consideration of safety.

Beyond the issue of safety, the polymer solutions must be "stable" to the etchant. This is a relative term, but in practice, what it means is that the molecular weight of the polymer and the resulting printability of the solutions must not change substantially during the time of printing. Thus it is observed that the printability of some of the polymer systems will degrade in performance in a matter of days or even hours. If the inks are to be prepared months ahead of time and stored, then this is clearly unacceptable, but if the inks can be prepared shortly before printing or even continuously during printing, then the performance becomes acceptable. In such a case, the components of the solution are prepared separately are combined in-line just before inkjetting.

Water is highly preferred for use with most etchants because it is compatible with many etchants and it is relatively innocuous. Water is desirably used in combination with a variety of hydrophilic organic solvents to modify the rate of evaporation, the wetting of the substrate, the compatibility with other additives. Water, as used herein, includes mixtures and combinations in which the major component of the dispersing vehicle is water.

The ability to utilize mixtures of solvents with the process disclosed herein provides considerable process advantages through operating latitude. Multiple solvents chosen to have specific evaporation or volatilization profiles can be critical in the development of uniform lines and edges, and in assuring adhesion of the printing ink to the substrate surface. In a preferred process, the primary solvent is water used in combination with other organic solvents having varied volatilities.

It is desirable that the vapor pressure of the organic molecules present in the dispersing vehicle be sufficiently low that it does not rapidly evaporate from the printed pattern at room temperature. Additionally, if the vapor pressure is too high, it may vaporize during heat treatment too rapidly, producing an image containing excessive defects.

It is generally desirable to wash the substrate after etching to remove the residues of the etching process. However, when the substrate has been modified rather than etched, washing may not be necessary. In some applications, any excess materials can be removed by volatilization or even burning out. It is often desirable that the enhancing polymeric components are eliminated during firing or heat treatment in such a way as to provide a final image that is substantially free of voids and defects. The polymers when burned out act as "fugitive polymers" that undergo 98-100% burnout under the firing conditions. The polymers are referred to as "fugitive polymers" because the polymer material can be removed from the surface of the substrate after the etching or modification process is complete. As opposed to the solvent components that are simply volatilized, the polymeric components generally undergo decomposition or oxidation during removal. Thus, an important factor in the choice of both the ultrahigh molecular weight components and the dispersant component is their thermal behavior as indicated by thermogravimetric analysis. In general, it is desired that the polymers leave behind no carbonaceous residue, thus aromatic polymers are generally not preferred. For example, ultrahigh molecular weight polymers or enhancing polymers containing a significant proportion of aromatic hydrocarbons, such as phenolic resin materials, can leave graphitic carbon particles on the surface of the substrate during firing, which can require significantly higher temperatures for complete removal. It is also desirable that the polymeric components do not melt or otherwise become fluid during the firing process, to avoid degradation of the printed image.

In some compositions, it is advantageous to include "enhancing polymers" in the etching solution for the purpose of modifying the behavior of the etchant solution during the printing process. The purpose of the enhancing polymers is to modify the viscosity and surface properties of the etchant or modifier solution while it is on the surface of the substrate. One result is the minimization of the spread of the etchant line to provide more narrow features. The weight average molecular weight of the "enhancing polymer" binder is preferably from about 2,000 to about 100,000, dependent upon the application. Weights less than 10,000 are generally useful because they do not adversely affect the viscosity of the composition.

One difficulty in printing fine features is that the printed etchant or modifier composition can wet the surface and rapidly spread to increase the width of the deposit, thereby negating the advantages of fine line printing possible. This is particularly true when printing is employed to generate fine features such as interconnects or conductors for displays.

Spreading of the etching or modifying composition is influenced by a number of factors. A drop of liquid placed onto a surface will either spread or not depending on the surface tensions of the liquid, the surface tension of the solid and the interfacial tension between the solid and the liquid. If the contact angle is greater than 90 degrees, the liquid is considered non-wetting and the liquid tends to bead or shrink away from the surface. For contact angles less than 90 degrees, the liquid can spread on the surface. For the liquid to completely wet, the contact angle must be zero. For spreading to occur, the surface tension of the liquid must be lower than the surface tension of the solid on which it resides.

The compositions can be confined on the substrate, thereby enabling the formation of features having a small minimum feature size, the minimum feature size being the smallest dimension in the x-y axis, such as the width of a conductive line. For example, the composition can be confined to regions having a width of not greater than 100 µm, preferably not greater than 75 µm, more preferably not greater than 50 µm, and even more preferably not greater than 25 µm. The present disclosure provides compositions and methods of processing that advantageously reduce the spreading of the composition. For example, small amounts of rheology modifiers such as styrene allyl alcohol (SAA) and other polymers can be added to the precursor composition to reduce spreading. The spreading can also be controlled through combinations of nanoparticles and precursors. Spreading can also be controlled by rapidly drying the compositions during printing by irradiating the composition during deposition.

A preferred method is to pattern an otherwise wetting substrate with non-wetting enhancement agents that control the spreading. For example, this can be achieved by functionalizing the substrate surface with trialkylsilyl, hydrocarbyl or fluorocarbon groups. In an extreme, this could be considered to be masking and would be particularly appropriate when it is desired to etch or modify complex patterns. For example, long straight etch lines could be interrupted by printing a mask perpendicular to the line direction.

Various other methods can be used to confine the composition on a surface, including surface energy patterning by increasing or decreasing the hydrophobicity (surface energy) of the surface in selected regions corresponding to where it is desired to confine the precursor or eliminate the precursor. These can be classified as physical barriers, electrostatic and magnetic barriers, surface energy differences, and process related methods such as increasing the composition viscosity to reduce spreading, for example by freezing or drying the composition very rapidly once it strikes the surface.

A preferred method is to simultaneously print two immiscible compositions, one containing etchant or modifier and the other without etchant or modifier side by side on a substrate in such a manner that the composition without etchant or modifier constrains the composition with functional phase particles to a specific surface area. The miscibility of the two compositions would be dictated largely by the dispersing vehicle. It is generally found that for ultrahigh molecular weight polymers, the solvent for a given polymer is limited, so it is likely that both the dispersing vehicle and the ultrahigh molecular weight polymer would be different to achieve immiscibility.

One embodiment of the process disclosed herein provides a set of printing compositions designed to minimize the spreading of lines. The composition set comprises at least two compositions. The two dispersing vehicles and their respective ultrahigh molecular weight polymers can be chosen to be immiscible, thereby providing the maximum resistance to line spreading. Alternatively, the dispersing media can be miscible or can be the same, relying upon the high solution viscosity of the ultrahigh molecular weight polymer to minimize interpenetration of the two compositions.

Another example of a method for depositing the composition is to heat the composition to a temperature higher than that of the substrate to decrease the viscosity of the composition during printing. Generally, the temperature difference between the composition and the substrate will be at least 10° C. before there is any noticeable effect of the heating. This can also have the advantage of volatilizing a portion of the dispersing vehicle before the etching or modifying composition reaches the substrate, thereby minimizing spreading of the line due to wetting of the surface. On the other hand, it is possible to volatilize the solvents too rapidly. Thus, it may be desirable to employ two or more solvents having significantly differing volatilities so that one is more quickly volatilized while another remains.

Another example of a method for depositing the composition is using a heated substrate to increase the rate of volatilization of the dispersing vehicle and the rate of etching or modification.

Another method for depositing the etching composition is to employ multi-pass deposition of the etchant to increase the depth of the etching reaction. A single layer can be deposited and allowed to react, followed by repetitions of this cycle. Sequential layers of etchant material do not have to be taken through sequential drying processes; additional depositions may be carried out before the previous layer is completely reacted. It is likely that the initial etching process will promote the wetting of subsequent layers of etchant. The use of multiple layers can be employed to etch substantial channels or vias on the surface of a substrate.

Channels on the surface of a substrate may be created and filled with modifier or etchant via the method of the process disclosed herein. This is essentially a masking process. The channels being filled may have been created by any of a number of processes. In this physical barrier approach, a confining structure is formed that keeps the etching or modifying composition from spreading. These confining structures may be trenches and cavities of various shapes and depths below a flat or curved surface, which confine the flow of the precursor composition. Such trenches can be formed by photochemical means. The physical structure confining the precursor can also be formed by mechanical means including embossing a pattern into a softened surface or means of mechanical milling, grinding or scratching features. Trenches can also be formed thermally, for example by locally melting a low melting point coating such as a wax coating. Alternatively, retaining barriers and patches can be deposited to confine the flow of composition within a certain region. For example, a photoresist layer can be spin coated on a polymer substrate. Photolithography can be used to form trenches and other patterns in this photoresist layer. These patterns can be used to retain precursor that is deposited onto these preformed patterns. After drying, the photolithographic mask may or may not be removed with the appropriate solvents without removing the deposited metal. Retaining barriers can also be deposited with direct write deposition approaches such as ink-jet printing or any other direct writing approach as disclosed herein.

The temperature of the inkjetting process is not critical but will be dependent upon the nature of the solvent being employed. For aqueous systems a temperature range of about 0° C. to about 80° C., preferably 30° C. to 60° C. is convenient. Obviously, higher temperatures will result in greater evaporation of the dispersing vehicle during the printing process and etching or modification process.

Relative humidity will affect the drying rate of the aqueous based systems and a lesser effect on the other solvent systems. This is generally reflected in the rate of drying of the etchant or modifier solution. Rapidly drying on the surface can lead to distortions of the edge features of the lines. For these reasons, some control of relative humidity is preferred. It is also useful to utilize bi-component solvents to control the drying profile.

The processes disclosed herein can be applied to a wide variety of surface materials on a wide variety of substrates. Substrates include glass, ceramics and plastics. Plastics that are particularly useful include polyfluorinated compounds, polyimides, epoxies (including glass-filled epoxy), polycarbonates and many other polymers.

Rigid substrates include, for example, glass, rigid crystalline or amorphous plastics, glass with various surface treatments, or various electrical components previously printed onto a rigid substrate. Rigid substrates are useful in display devices such as plasma display panels, or liquid crystal displays. Substrates such as crystalline and amorphous silicon for solar energy devices may be printed using the processes disclosed herein.

Flexible or semiflexible substrates can be used for some applications. The substrates includes flexible plastics such as Mylar® poly(ethylene terephthalate), or other polyester films, Kapton® polyimide films, paper, surface-coated paper, polyethylene, polypropylene and biaxially-oriented polypropylene, or other natural and synthetic polymer systems. The printed flexible substrates can be or be incorporated into the final device. Alternatively, the image printed on the flexible substrate can be transferred onto the final device.

In general, the processes disclosed herein can be employed for the removal of thin coatings or layers of materials on the surface of the substrate (surface layer). In general the coatings or layers range between tenths to several microns in thickness.

It is desirable to avoid dirt contamination in the process of preparing ink compositions and in preparing parts, since such contamination can lead to defects.

It should be noted that etching and modification are stoichiometric reactions requiring quantities of reagent greater than some minimal value to be able to go to completion. In the examples below, there are instances where wider lines are etched completely so there is no conductivity, but thinner lines are not. The volume of etchant in a particular drop will be proportional to the cube of the radius while the width of the line will be proportional to the radius. Thus, as drops become smaller, the volume of etchant applied in a single printed line is falling off as the square. Additionally, the thickness of the material being etched can be varied. A thicker layer of material will require a greater quantity of etchant to be completely penetrated than a thinner layer. Thus, in the examples below, failure to completely penetrate a given surface layer is not an indication of a failed experiment. Rather, it is an example of providing less etchant to the site than was required to achieve full penetration, while etching did in fact occur. Complete etching of thicker layers or thinner lines can be accomplished by sequentially inkjetting more than one pass of etchant across the same location. If the printed line is the same width, a second pass would double the quantity of etchant delivered to that location, thereby doubling the depth of the etching reaction. Multiple pass printing can be carried out as many times as is required to accomplish the level of etching required for the application.

Applications

The process(es) of the present have particular utility in the manufacture of articles selected from the group comprising a display device, a plasma display panel, a field emission display device, a photovoltaic device, a liquid crystal display device, a solar cell panel, an electrochemical cell, a printed circuit, an antenna, a shielding device for electromagnetic radiation, a resistance heater device for automobile windows, an electrochromic window device, microwave circuits, control modules, information storage devices, and EKG electrodes.

The present invention provides method(s) of forming a device, particularly the devices named in the preceding paragraph, comprising the steps of: providing a substrate having a surface layer thereon wherein said surface layer comprises a substrate-side and a surface-side; providing a deposit composition comprising from 1 to 50 percent by weight of an etchant or modifier in a dispersing vehicle; jetting droplets of said deposit composition onto the surface-side of said surface in an image-wise manner; allowing the etchant or modifier in the composition to react with the surface layer on said substrate thus forming products of the etching reaction and thereby removing or otherwise modifying the physical properties of the surface layer in the desired image.

The present invention has particular utility in Radio Frequency Identification (RFID) applications. In particular, the present invention is useful as a means for the formation of RFID tags. RFID is a means of identifying a person or object using a radio frequency transmission. The technology can be used to identify, track, sort or detect a wide variety of objects. Communication takes place between a reader and a transponder, often called a tag. Tags can be either active or passive and come in various forms including Smart cards, Tags, Labels, watches and may even be embedded in devices such as mobile phones. A typical RFID tag (device) comprises a conductive element connected to an integrated circuit. One particular embodiment of the present invention is the method of the present invention in the formation of phonecards (i.e., one embodiment of an RFID tag).

The main advantage of this RFID system, over bar coding items, is that data can be read without having to have clear image of the barcode. Thus, a reader can read dirty boxes, can read stacks of boxes and can read all the codes on the items inside a packaging crate. Tags can come in many shapes and sizes—from the size of a small house brick to the size of a postage stamp—and can have a wide variety of capabilities—from simple data storage to capabilities including GPS receivers and temperature sensors.

In a typical RFID tag (device), an ITO surface layer is deposited on a polyester plastic substrate. The method of the present invention allows for the surface layer to be modified or altered through the deposition via ink jet printing of the deposit composition onto the surface layer. The deposit composition is jetted in an "image-wise" pattern to create the desired functional circuit pattern. The circuit pattern is created by allowing the deposit composition to react with the surface layer. The surface layer in contact with the deposit composition is altered and the deposit composition and any products of the reaction may optionally be removed, typically by washing, to form the desired remaining conductive pattern. Once the desired pattern is formed, the substrate and surface layer may then be partially or entirely coated with a non-conductive encapsulant composition for the purpose of protecting the created pattern. Useful encapsulant compositions are thick film encapsulant compositions, well known to those skilled in the art. One possible encapsulant composition is Thick Film Polymeric Composition Commercial Product Number 8155 available from E.I. du Pont de Nemours and Company. It is noted that the encapsulant composition may be useful in many applications or embodiments of the present invention and is not limited solely to the RFID related applications.

EXAMPLES

This invention is illustrated by the following examples that are merely for the purpose of illustration and are not to be regarded as limiting the scope of the invention or the manner in which it can be practiced.

Example 1

Etching ITO on Mylar

An aqueous solution of 20% HCL and 5% $HNO_3$ was prepared for use in etching an ITO (indium tin oxide) layer on a Mylar® substrate. The initial solution was then diluted to one tenth its original concentration in water and 0.1% Silwet L77 (Silicone-polyethercopolymer, Loveland Industries, Inc., Greeley, Colo.) was added as a surfactant. This etchant ink was printed on the MicroFab Jetlab® (MicroFab®, Plano, Tex.). Several prints were attempted. In the first attempt, the Mylar was cleaned a Plasma Preen II 973, (Plamatic Systems Inc., North Brunswick, N.J.). The time was 1.5 minutes at an intensity level of 30%. This cleaning process caused the printed lines to wet the surface and spread.

A second set of prints were performed using the ITO-printed Mylar as received without plasma cleaning and this caused an improvement in the quality of the lines. The lines printed were between 60-100 microns wide. A 60 micron nozzle was used to print squares with dot pitches of 30, 40, 50, 60, and 70 microns. Measurement of the conductivity of the film from the center of the square to the outside with a BK Toolkit 2703B volt/ohm Multimeter (B&K Precision Corporation, Yorba Linda, Calif.) indicated that there was no conductivity, but conductivity in portions that had not been etched was good. The solution had etched the ITO down to the substrate Mylar.

Example 2

Etching ITO on Mylar

An aqueous solution containing a higher concentration of HCL (40%) and $HNO_3$ (10%) was prepared for use in etching an ITO (indium tin oxide) layer on a Mylar® substrate. Silwet L77 (1%) was added as a surfactant and polyethyleneglycol (5 wt %) was added to the solution. This etchant ink was printed on the MicroFab Jetlab® I station.

A set of prints were performed using the ITO-printed Mylar as received without plasma cleaning. A 60 micron nozzle was used to print squares with dot pitches of 30, 40, 50, 60, and 70 microns. The addition of PEG and higher concentration of HCl led to reduced spreading of the solution and improved resolution of the patterning relative to example 1. Measurement of the conductivity of the film from the center of the square to the outside with a BK Toolkit 2703B volt/ohm Multimeter (B&K Precision Corporation, Yorba Linda, Calif.) indicated that there was no conductivity, but conductivity in portions that had not been etched was good. The solution had etched the ITO down to the substrate Mylar.

Example 3

Sodium Thioglycolate Etching of Ni and Cu on Glass

A saturated solution of sodium thioglycolate (Aldrich Chemical, Milwaukee, Wis., 5 mL) in water was prepared by stirring with an excess of sodium thioglycolate and then decantation from the solids. To the solution in a 25 mL vial was added diethylene glycol (1.60 g, Aldrich Chemical, Milwaukee, Wis.,), PEG 1500 (0.80 g, Aldrich Chemical, Milwaukee, Wis.), and Dowanol DB (diethylene glycol monobutyl ether, 1.28 g, Aldrich Chemical, Milwaukee, Wis.) and the contents were mixed thoroughly. The resulting ink was ink jettable on the MicroFab system.

Lines of the solution were jetted across glass slides that had been sputter-coated with copper and nickel films. Single-pass lines did not penetrate the copper or nickel films. With multiple passes of the ink jetter, it was possible to etch completely through the copper and nickel films, but more passes were required on the nickel-coated substrate. Measurement of the conductivity of the film across the multi-pass lines with the Multimeter (BK Toolkit 2703B volt/ohm Multimeter, B&K Precision Corporation, Yorba Linda, Calif.) indicated that there was no conductivity and etching was complete for the copper and the nickel.

Example 4

Sodium Thiosulfate Etching of Copper on Glass

A saturated solution of sodium thiosulfate (Aldrich Chemical, Milwaukee, Wis.,) in water (5 mL) was prepared by stirring with an excess of sodium thiosulfate and then decantation from the solids. To the solution in a 25 mL vial was added diethylene glycol (1.60 g), PEG 1500 (0.80 g), and Dowanol DB (diethylene glycol monobutyl ether, 1.28 g) and the contents were mixed thoroughly. The resulting ink was ink jettable on the MicroFab system.

Lines of the thiosulfate solution were jetted across glass slides that had been sputter-coated with a copper film. Single-pass lines did not penetrate the copper films. With multiple passes of the ink jetter, it was possible to etch completely through the film. Measurement of the conductivity of the film across the multi-pass lines on the copper plated glass with the Multimeter indicated that there was no conductivity and etching was complete.

Acid Etching of ITO on PET

A solution of TE-100 (25-30% Ferric Chloride/1-5% HCl/H20, Trancene Co.) and 10K PEG (Aldrich) in distilled water was prepared by adding a 60% TE-100/40% $H_2O$ solution to a mixture of 60% 10K PEG/40% $H_2O$ and mixing using a VWR Mini-Vortex mixer (VWR, Inc., West Chester, Pa.). A 2 in×2 in square of ITO on PET (Techni-Met Inc., 5 mil 453 coated with ITO giving 10 ohms/sq.) was cleaned using a MEOH wipe to prepare it for etching. A MicroFab Jetlab 1 with a 60 µm jethead was used. The general program used to inkjet incorporated 0.035 mm steps (center-to-center for drops) per line and an offset of 0.025 per pass for each line. Multiple passes were used to 'fill in' each line. This process produced etched dots approx. 200 µm in diameter having 50-75 µm gaps between dots.

What is claimed is:

1. A process comprising the steps of:
providing a plastic substrate having an indium tin oxide surface layer thereon wherein said surface layer comprises a substrate-side and a surface-side;
providing a deposit composition comprising from 1 to 50 percent by weight of an etchant or modifier in a dispersing vehicle;
jetting droplets of said deposit composition onto the surface-side of said surface layer in an image-wise manner;
allowing the etchant or modifier in the composition to react with selected areas on the surface layer on said substrate thus forming products of the etching reaction and thereby removing or otherwise modifying the physical properties of the surface layer in the desired image.

2. The process of claim 1 further comprising washing the surface layer of said substrate to partially or completely remove the composition and the products of the etching reaction.

3. The process of claim 1 wherein the steps of jetting droplets of said deposit composition onto the surface-side of said surface in an image-wise manner and allowing the etchant or modifier in the composition to react with the surface layer on said substrate thus forming products of the etching reaction and thereby removing or otherwise modifying the physical properties of the surface layer in the desired image are carried out substantially simultaneously and continuously.

4. The process of claim 1 wherein the weight fraction of the etchant or modifier is from 5 to 30 percent of the deposit composition.

5. The process of claim 1 in which two or more adjacent lines of compositions, one a deposit composition and one without etchant or modifier, are simultaneously jetted onto the surface layer of said substrate in contact with one other.

6. The process of claim 1 wherein the surface-side of the surface layer has been chemically modified to have a surface energy different than that of the natural surface energy of the surface layer to make it more non-wetting to minimize spreading of the deposit composition.

7. The process of claim 1, further comprising the step of modifying said substrate, wherein said substrate has a first portion and a second portion, and wherein said first portion is modified to have a surface energy that is different than the surface energy on a second portion of said substrate, and wherein said first portion is adapted to confine said deposit composition.

8. The process of claim 1 wherein the deposit composition is heated relative to the substrate.

9. The process of claim 1 wherein the surface layer of the substrate is heated relative to the deposit composition.

10. The process of claim 1 wherein the substrate is rigid.

11. The process of claim 1 wherein the plastic substrate is a polyester plastic substrate.

12. The process of claim 1 wherein the substrate is flexible.

13. The process of claim 1 wherein the etchant is a strong acid.

14. The process of claim 1 wherein the etchant comprises a mixture of hydrochloric acid and water.

15. The process of claim 1 wherein the etchant is combined with a polymer solution in the dispersing vehicle immediately prior to a printing process.

16. A method of forming an RFID device comprising the steps of:

providing a plastic substrate having an indium tin oxide surface layer thereon wherein said surface layer comprises a substrate-side and a surface-side;

providing a deposit composition comprising from 1 to 50 percent by weight of an etchant or modifier in a dispersing vehicle;

jetting droplets of said deposit composition onto the surface-side of said surface in an image-wise manner;

allowing the etchant or modifier in the composition to react with selected areas on the surface layer on said substrate thus forming products of the etching reaction and thereby removing or otherwise modifying the physical properties of the surface layer in the desired image.

17. The method of claim 16 further comprising depositing an encapsulant composition onto said surface layer and substrate, wherein said encapsulation composition either partially or entirely covers said surface layer and substrate.

* * * * *